United States Patent [19]

Wright

[11] Patent Number: 4,833,424

[45] Date of Patent: May 23, 1989

[54] LINEAR AMPLIFIER WITH TRANSIENT CURRENT BOOST

[75] Inventor: John W. Wright, Los Altos, Calif.

[73] Assignee: Elantec, Milpitas, Calif.

[21] Appl. No.: 177,511

[22] Filed: Apr. 4, 1988

[51] Int. Cl.⁴ .............................................. H03F 3/26
[52] U.S. Cl. ..................................... 330/267; 330/288
[58] Field of Search ....................... 330/288, 267, 296; 323/313, 316

[56] References Cited

U.S. PATENT DOCUMENTS

| | | |
|---|---|---|
| 3,434,069 | 3/1969 | Jones . |
| 3,493,881 | 2/1970 | Zuch . |
| 3,638,132 | 1/1972 | Trilling ................................. 330/69 |
| 3,668,543 | 6/1972 | Balley . |
| 3,769,605 | 10/1973 | Long . |
| 3,868,583 | 2/1975 | Krabbe . |
| 4,147,944 | 4/1979 | Monticelli ........................... 307/362 |
| 4,157,493 | 6/1979 | Monticelli ............................... 323/9 |
| 4,433,305 | 2/1984 | Ozawa et al. ....................... 330/288 |
| 4,481,481 | 11/1984 | Sleeth et al. ........................ 330/296 |
| 4,570,128 | 2/1986 | Monticelli ........................... 330/267 |
| 4,701,720 | 10/1987 | Monticelli ........................... 330/260 |

Primary Examiner—Gene Wan
Attorney, Agent, or Firm—A. C. Smith

[57] ABSTRACT

An improved linear amplifier circuit includes current mirror circuits that are cross connected in the collector circuits of input transistors for supplying proportional current to circuit nodes from which signal is derived for controlling the output stages. The states for supplying boost current to the circuit nodes are stabilized in quiescent condition to avoid delays commonly associated with the turning on of a non-conducting stage.

3 Claims, 3 Drawing Sheets 4,833,424

LINEAR AMPLIFIER WITH TRANSIENT CURRENT BOOST

BACKGROUND OF THE INVENTION

Field of Invention

This invention relates to buffer amplifiers and more particularly to an amplifier which is capable of changing output current level rapidly without need for high levels of quiescent current.

Conventional DC-coupled linear amplifiers commonly use push-pull output stages that alternate between on and off conduction conditions on applied signals of alternating polarity. Thus, during positive rise of output current, one output stage is heavily conductive and another output stage is tending toward non-conduction. The conditions reverse on negative rise of output current. For high rates of change, the current through the heavily conductive output stage may not be sufficient to keep up with the load requirement and output signal distortion results. One technique used to overcome this condition included increasing the quiescent current level in the output stages to assure that ample current is available during rapid changes. However, this technique has the disadvantage of requiring substantial levels of idle current from the power supply with concomitant higher power dissipation, and higher junction temperatures which may require heat sinks.

SUMMARY OF THE INVENTION

In accordance with the present invention, the collectors of driver-stage transistors are connected to current mirror circuits that are also connected to bias the input and driver stages. The circuit node at the input to the driver stage is connected to the current mirror and is enabled to change signal level very rapidly on boost current supplied thereto. The output stages that are driven from signal at such circuit node are thus able to follow rapid signal changes without requiring high levels of quiescent current.

DESCRIPTION OF THE PREFERRED EMBODIMENT

Figure 1:
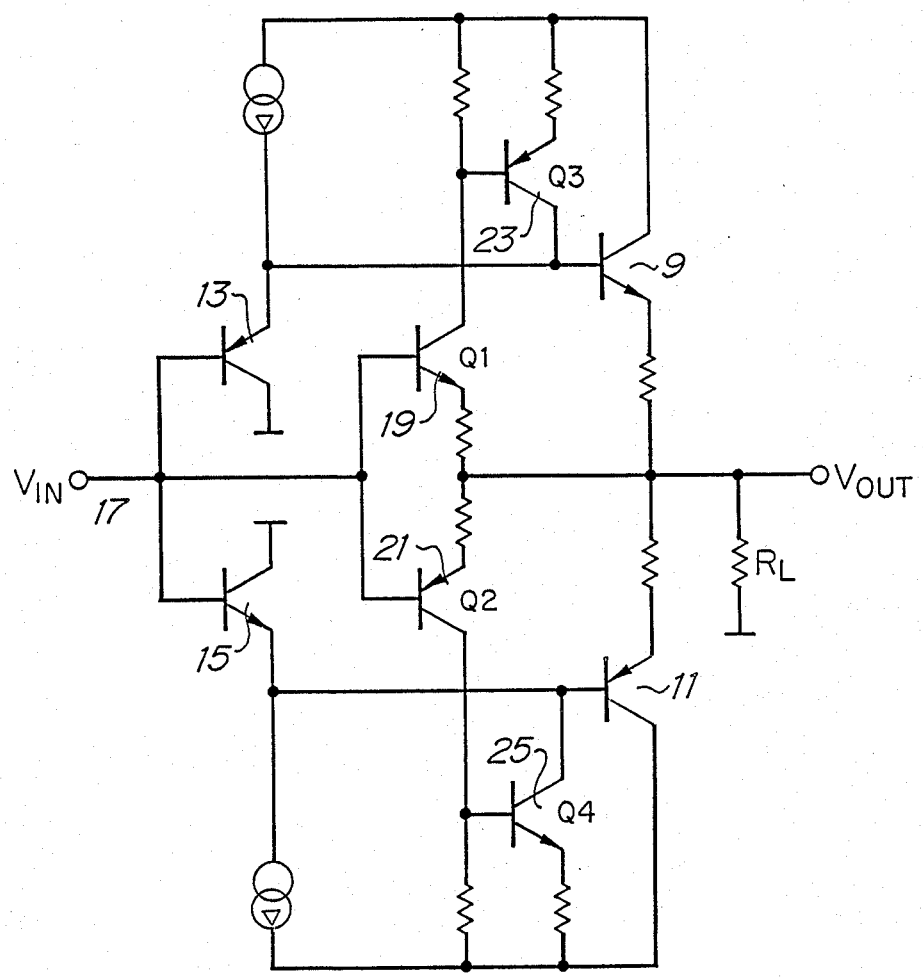
FIG. 1 is a schematic diagram of a conventional single-ended linear amplifier with current-boost circuitry.

Referring now to FIG. 1, there is shown a schematic diagram of a conventional single-ended linear amplifier in which the complementary conductivity type output transistors 9, 11 are normally driven by the complementary conductivity type input transistor 13, 15 on applied signal at input node 17. Intermediate gain stages 19, 21 are coupled to the input node 17, and one of such stages turns on upon differential input to output voltage of proper polarity, and this, in turn, controls the associated one of the transistors 23, 25 to supply additional current to the base of the associated output transistor 9, 11. One disadvantage of a circuit of this type is that it requires signal of more than the base-emitter voltage drop (0.7 v) to supply the additional or boost current to the base of the output transistor, and the circuit requires additional transistors to supply the requisite boost current. Also, it is difficult to provide current limiting in a circuit of this type.

Figure 2:
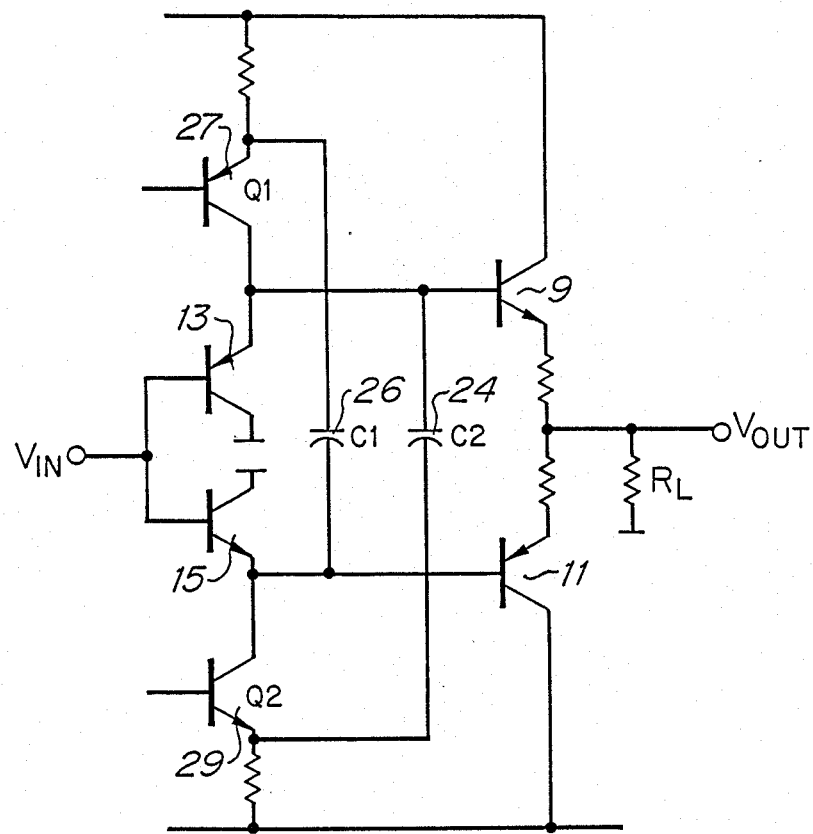
FIG. 2 is a schematic diagram of a conventional single-ended linear amplifier with capacitive current-boost circuitry.

Referring now to FIG. 2, there is shown another conventional single-ended amplifier circuit in which capacitors 24, 26 are connected to boot-strap the emitters of intermediate driver transistors 27, 29 that are connected to supply additional base current to the output transistors 9, 11. One disadvantage of a circuit of this type for supplying boost current on rapid signal changes is that capacitors 24, 26 can consume large amounts of area on circuit chip, and such capacitors become less effective to control additional boost current beyond a certain rate of change of signal.

Figure 3:
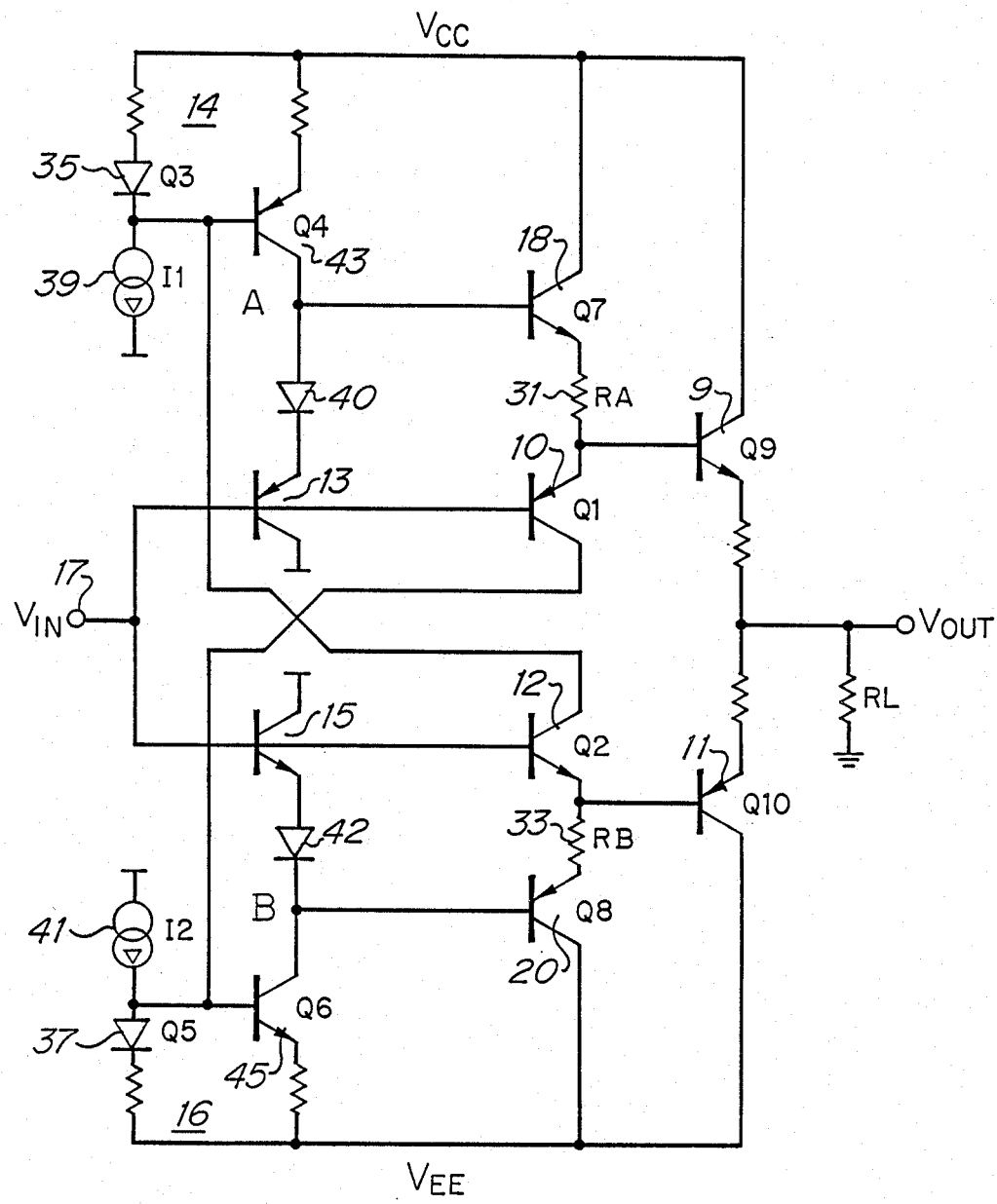
FIG. 3 is a schematic diagram of one embodiment of the amplifier of the present invention including current mirror circuits to supply boost current to cross-connected driver stages.

Referring now to FIG. 3, there is shown a schematic diagram of the illustrated embodiment of the present invention. The collectors of the transistors 10, 12 are connected to the current mirror circuits 14, 16 that are connected in the bias circuits of the input transistors 13, 15 and the driver transistors 18, 20. During first positive signal transistions at input node 17, the collector current in transistor 12 is mirrored to a proportional current into node A from the current mirror circuit 14, and this causes the node A to rise rapidly (in the positive direction). Transistor 18 is connected in common collector configuration to respond to signal at node A and drive the base of output transistor 9. Similarly, for fast negative signal transistors at input node 17, the collector current in transistor 10 is mirrored to a proportional current into node B from the current mirror circuit 16, and this causes the node B to rise rapidly (in the negative direction). Transistor 20 is connected in the common collector configuration to respond to signal at node B and drive the base of output transistor 11. Forward-biased diodes 40, 42 are connected between the current mirror circuits 14, 16 and the emitters of the associated input transistors 13, 15. Resistors 31 and 33 are connected, respectively, between the emitters of transistors 10 and 18, and 12 and 20 and serve, in conjunction with the voltage drops across diodes 40, 42, to stabilize the currents through such pairs of transistors against thermal instability, and also to set the quiescent current through these transistors. Each of the current mirror circuits 14 and 16 may include a diode-connected transistor 35, 37 and current source 39, 41 with the common connection thereof cross connected to the collector of the associated transistor 12, 10 and to the base of the associated transistor 43, 45.

In operation, the circuit of the present invention supplies requisite boost current on rapid signal changes without having to turn on the boost current stages from a fully off conduction state. This assures that requisite boost current is available immediately. In addition, the boost current is supplied to the circuit node A, B in response to rapid signal changes at the input, rather than merely in response to changes in the input-to-output differential voltage. Further, without the need for capacitors to control the supply of boost current, the circuit of the present invention is capable of settling or recovering more quickly on transient signal conditions and can be fabricated on smaller circuit chips for operation with lower power dissipation and concomitant lower operating temperatures.

I claim:

1. An amplifier circuit comprising:

an output stage including a pair of complementary conductivity type transistors connected in common collector configuration with the emitters thereof connected in common to an output;

a pair of current mirror circuits, each having a controlling current port and having an output current port coupled to a circuit node;

an input stage including a pair of complementary conductivity type transistors having bases connected in common to receive applied signal and having emitters connected to the bases of respective ones of the transistors in the output stage and having collectors cross connected to the controlling current port of respective ones of the current mirror circuits; and unity gain stages coupled to the bases of the transistors in the output stages for supplying thereto signals representative of the signal on respective ones of the circuit nodes.

2. An amplifier as in claim 1 comprising:

an auxiliary input stage including a pair of complementary conductivity type transistors connected in common collector configuration with a base connected to receive applied signal; and means connecting the emitters of the transistors in the auxiliary input stage to respective ones of the circuit nodes.

3. An amplifier as in claim 2 wherein said unity gain stages each includes a transistor of conductivity type opposite the conductivity type of transistor in the input stage, and connected in common collector configuration with base connected to the respective circuit node;

resistor means coupling the emitters of respective ones of the transistors in the auxiliary input stage for supplying voltage drop thereacross to establish conduction of quiescent current through the transistors in the unity gain stages and in the input stage.

* * * * *